United States Patent
Ohira et al.

(10) Patent No.: US 8,611,392 B2
(45) Date of Patent: Dec. 17, 2013

(54) SEMICONDUCTOR LASER

(75) Inventors: Kazuya Ohira, Tokyo (JP); Haruhiko Yoshida, Chiba-ken (JP); Mizunori Ezaki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 204 days.

(21) Appl. No.: 13/050,416

(22) Filed: Mar. 17, 2011

(65) Prior Publication Data

US 2012/0069862 A1    Mar. 22, 2012

(30) Foreign Application Priority Data

Sep. 16, 2010   (JP) .................................. 2010-208557

(51) Int. Cl.
   *H01S 5/00* (2006.01)
   *H01S 3/097* (2006.01)
   *H01S 3/08* (2006.01)
   *H01S 3/083* (2006.01)

(52) U.S. Cl.
   USPC ............. 372/94; 372/87; 372/92; 372/46.013

(58) Field of Classification Search
   USPC ...................... 372/94, 46.013, 46.015, 87, 92
   See application file for complete search history.

(56) References Cited

U.S. PATENT DOCUMENTS 6,275,296 B1    8/2001  Numai

FOREIGN PATENT DOCUMENTS

| JP | 10-303497 | * | 11/1998 |
| JP | 10-303497 A | | 11/1998 |
| JP | 2000-356522 A | | 12/2000 |
| JP | 2001-108447 | | 4/2001 |
| JP | 2002-33550 | | 1/2002 |
| JP | 2002-033550 | * | 1/2002 |

OTHER PUBLICATIONS

Office Action issued Nov. 6, 2012, in Japanese Patent Application No. 2010-208557 with English translation.
U.S. Appl. No. 13/247,072, filed Sep. 28, 2011, Ohira, et al.

* cited by examiner

*Primary Examiner* — Armando Rodriguez
(74) *Attorney, Agent, or Firm* — Oblon, Spivak, McClelland, Maier & Neustadt, L.L.P.

(57) ABSTRACT

In one embodiment, a semiconductor laser includes a semiconductor laminated body formed in a ring shape and first and second electrodes. The semiconductor laminated body includes an active layer, first and second cladding layers formed on both sides of the active layer, first and second contact layers formed on the first and second cladding layers, and first and second modified layers. The first and second modified layers are formed by selectively modifying the inner peripheral sidewalls and the outer peripheral sidewalls of the first and second cladding layers so as to have a refractive index lower than the refractive indexes of the first and second cladding layers. The first and second contact layers are electrically connected to the first and second electrodes.

15 Claims, 20 Drawing Sheets

US 8,611,392 B2

SEMICONDUCTOR LASER

CROSS REFERENCE TO RELATED APPLICATION

This application is based upon and claims the benefit of priority from the prior Japanese Patent Application No. 2010-208557, filed on Sep. 16, 2010, the entire contents of which are incorporated herein by reference.

FIELD

Embodiments described herein relate generally to a semiconductor laser.

BACKGROUND

Large scale integration (LSI) become smaller and have higher densities, and this in turn increases resistances and capacitances of wirings in the circuits, resulting in transmission delays. Accordingly, optical interconnect technology attracts attention.

A semiconductor laser having a micro ring resonator structure has been known as a small light source for the optical interconnect technology. In this kind of semiconductor laser, however, the intensity distribution of laser-oscillated light circulating in a ring is unevenly distributed in proximity to sidewalls of the ring.

As a result, the following problems occur. Light loss increases due to scattering of light caused by roughness of the sidewalls. Carrier loss increases due to surface recombination and surface trap level caused by damage of the sidewalls.

A semiconductor laser is made into a thin film so that the semiconductor laser is mounted on a large scale integration. As a result, there is a problem in that an overlap increases between an internal light intensity distribution and a high density contact layer/an electrode, which increases the light loss caused by the high density contact layer and the electrode.

Therefore, there is a problem in that a sufficient laser oscillation characteristic cannot be obtained.

DETAILED DESCRIPTION

Figure 1:
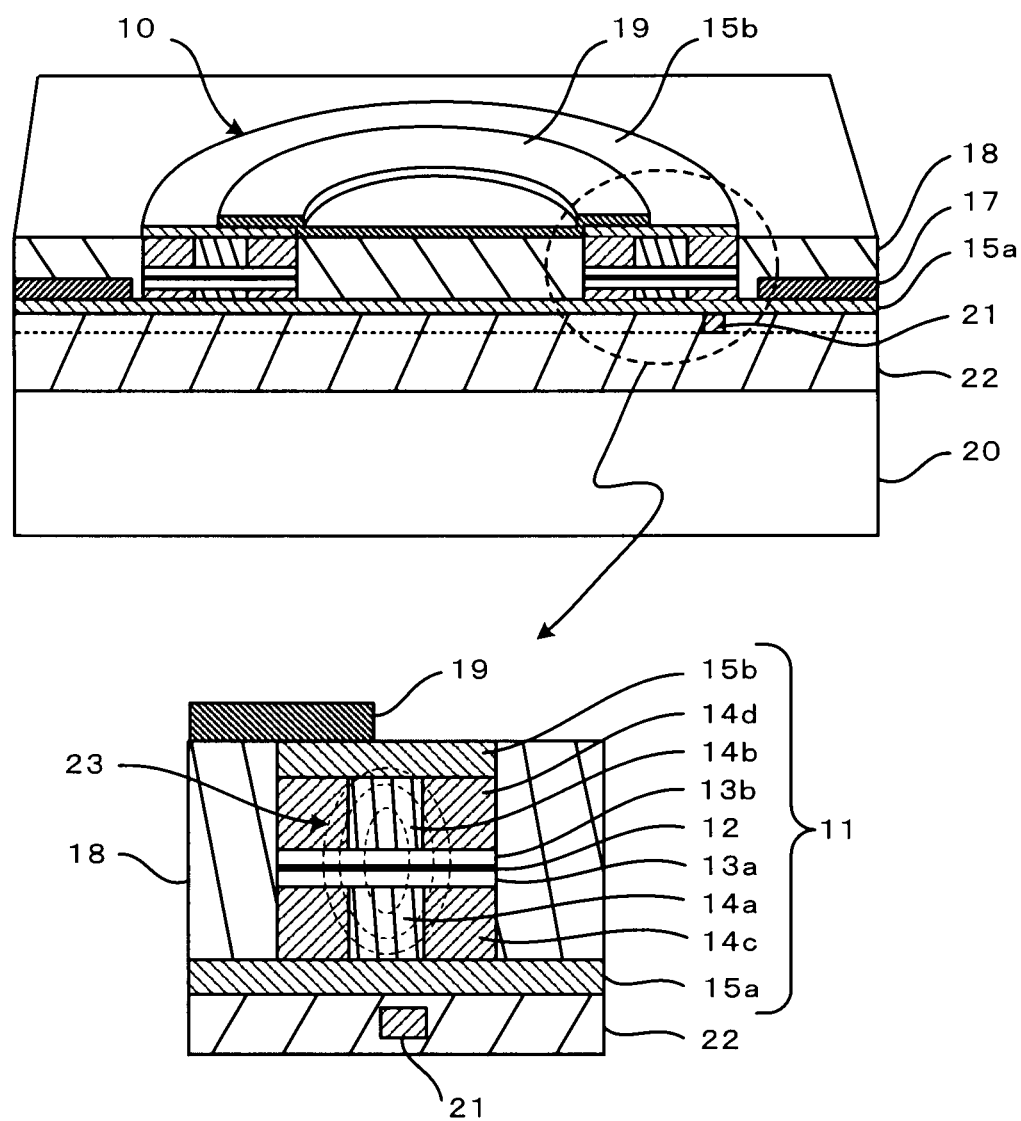
FIG. 1 is a cross sectional perspective view showing a semiconductor laser according to a first embodiment.

In one embodiment, a semiconductor laser includes a semiconductor laminated body formed in a ring shape and first and second electrodes. The semiconductor laminated body includes an active layer, first and second cladding layers formed on both sides of the active layer, first and second contact layers formed on the first and second cladding layers, and first and second modified layers. The first and second modified layers are formed by selectively modifying the inner peripheral sidewalls and the outer peripheral sidewalls of the first and second cladding layers so as to have a refractive index lower than the refractive indexes of the first and second cladding layers. The first and second contact layers are electrically connected to the first and second electrodes.

Hereinafter, further embodiments will be described with reference to the drawings. In the drawings, same reference characters denote the same or similar portions.

First Embodiment

A semiconductor laser of the embodiment will be explained with reference to FIG. 1. The embodiment relates to an example of a ring-shaped semiconductor laser mounted on a semiconductor substrate so that the ring-shaped semiconductor laser is optically coupled with an optical waveguide provided on the semiconductor substrate.

As shown in FIG. 1, a semiconductor layer (semiconductor laminated body) 11 in a semiconductor laser 10 of the embodiment includes an active layer 12, first and second light confinement layers 13a, 13b formed on both sides of the active layer 12, first and second cladding layers 14a, 14b formed on the first and second light confinement layers 13a, 13b, and first and second contact layers 15a, 15b formed on the first and second cladding layers 14a, 14b.

In the semiconductor layer 11, the first contact layer 15a is in a tabular shape. The active layer 12, the first and second light confinement layers 13a, 13b, the first and second cladding layers 14a, 14b, and the second contact layer 15b are in a ring shape.

The first cladding layer 14a, the first light confinement layer 13a, the active layer 12, the second light confinement layer 13b, the second cladding layer 14b, and the second contact layer 15b in the ring shape are formed in this order on the first contact layer 15a in the tabular shape. Therefore, the first contact layer 15a extends from an inner side of the ring to an outer side of the ring.

An outer peripheral sidewall and an inner peripheral sidewall of the first cladding layer 14a are oxidized by heat, so that they are modified into first modified layers 14c with a refractive index lower than the refractive index of the first cladding layer 14a. Therefore, in the first cladding layer 14a, a central portion sandwiched by the modified layers 14c at the inner peripheral portion and the outer peripheral portion functions as the original first cladding layer.

Likewise, an outer peripheral sidewall and an inner peripheral sidewall of the second cladding layer 14b are oxidized by heat, so that they are modified into second modified layers 14d with a refractive index lower than the refractive index of the second cladding layer 14b. Therefore, in the second cladding layer 14b, a central portion sandwiched by the modified layers 14d at the inner peripheral portion and the outer peripheral portion functions as the original second cladding layer.

A ring-shaped first electrode 17 concentric with the semiconductor layer 11 is formed on the first contact layer 15a. The first electrode 17 is embedded in an insulating film 18, and the first electrode 17 is connected to a via (not shown) which is exposed on an upper surface of the insulating film 18.

The semiconductor layer 11 is embedded in the insulating film 18 in such a manner that an upper surface of the second contact layer 15b is exposed. A discoidal second electrode 19 is formed on an inner peripheral portion of an upper surface of the second contact layer 15b and the insulating film 18 in which the inner side of the semiconductor layer 11 is embedded. The second electrode 19 is formed on a portion of the second contact layer 15b.

The semiconductor layer 11 is a resonator in which light circulates along the outer periphery of the circular shape. The resonator is mounted on a semiconductor substrate 20 so that the resonator is optically coupled with an optical waveguide 21 arranged on the semiconductor substrate (substrate) 20.

The optical waveguide 21 is embedded into a cladding layer 22 formed on the semiconductor substrate 20. A first contact layer 15a is formed on the cladding layer 22, and the semiconductor layer 11 is provided above the optical waveguide 21, so that the resonator is optically coupled with the optical waveguide 21.

The active layer 12 is an undoped multiple quantum well, for example. The active layer 12 is structured by alternately depositing three layers of InGaAs quantum well layer having a thickness of 8 nm and GaAs barrier layer having a thickness of 10 nm, and sandwiching both sides thereof with Al0.1Ga0.9As layers having a thickness of 40 nm.

The first and second light confinement layers 13a, 13b are P-type and N-type GaAs layers each having a thickness of 100 nm, for example. The first and second cladding layers 14a, 14b are P-type and N-type $Al_{0.92}Ga_{0.08}As$ layers each having a thickness of 300 nm, for example. The first and second contact layers 15a, 15b are P-type and N-type GaAs layers each having a thickness of 10 nm, for example.

The first and second modified layers 14c, 14d are layers obtained by thermally oxidizing the first and second cladding layers 14a, 14b. Each of the first and second modified layers 14c, 14d has a refractive index lower than the refractive indexes of the first and second cladding layers 14a, 14b, and has an electrical insulating property.

The first electrode 17 is an AuZn alloy, for example. The second electrode 19 is an AuGe alloy, for example. The first electrode is an anode electrode, and the second electrode is a cathode electrode. The insulating film 18 is silicon oxide film ($SiO_2$), for example.

The semiconductor substrate 20 is a silicon substrate, for example. The cladding layer 22 is a silicon oxide film, for example. The optical waveguide 21 is an amorphous silicon film, for example.

The ring of the semiconductor layer 11 has an outer diameter of about 10 μm, an inner diameter of about 5 μm, and a thickness of about 1 μm, for example. The first electrode 17 is connected to a positive terminal of a power supply (not shown). The second electrode 19 is connected to a negative terminal of the power supply. When the semiconductor layer 11 is energized in this state, carriers are injected into the active layer 12. Stimulated emission is caused when the injected carriers are recombined.

Light generated by stimulated emission is repeatedly, totally reflected between the inner peripheral side interfaces and the outer peripheral side interfaces of the first and second cladding layers 14a, 14b and the first and second modified layers 14c, 14d in an alternating manner. Thus, the light circulates in the ring-shaped resonator, and makes laser oscillation. A plurality of elliptic rings indicated by broken lines schematically denote light intensity distribution 23 in a circulating mode.

The above semiconductor laser 10 is configured to reduce the roughness and the damage of the outer peripheral side interfaces and the inner peripheral side interfaces between the first and second cladding layers 14a, 14b and the first and second modified layers 14c, 14d, as compared with the roughness and the damage of the outer peripheral sidewalls and the inner peripheral sidewalls of the first and second unmodified cladding layers 14a, 14b. Thus, the semiconductor laser 10 is configured to achieve a sufficient laser oscillation characteristic.

Further, in the semiconductor laser 10, the first and second modified layers 14c, 14d having electrical insulating property make a current confinement structure. Thus, the semiconductor laser 10 is configured to achieve still more sufficient laser oscillation characteristic.

Figure 2:
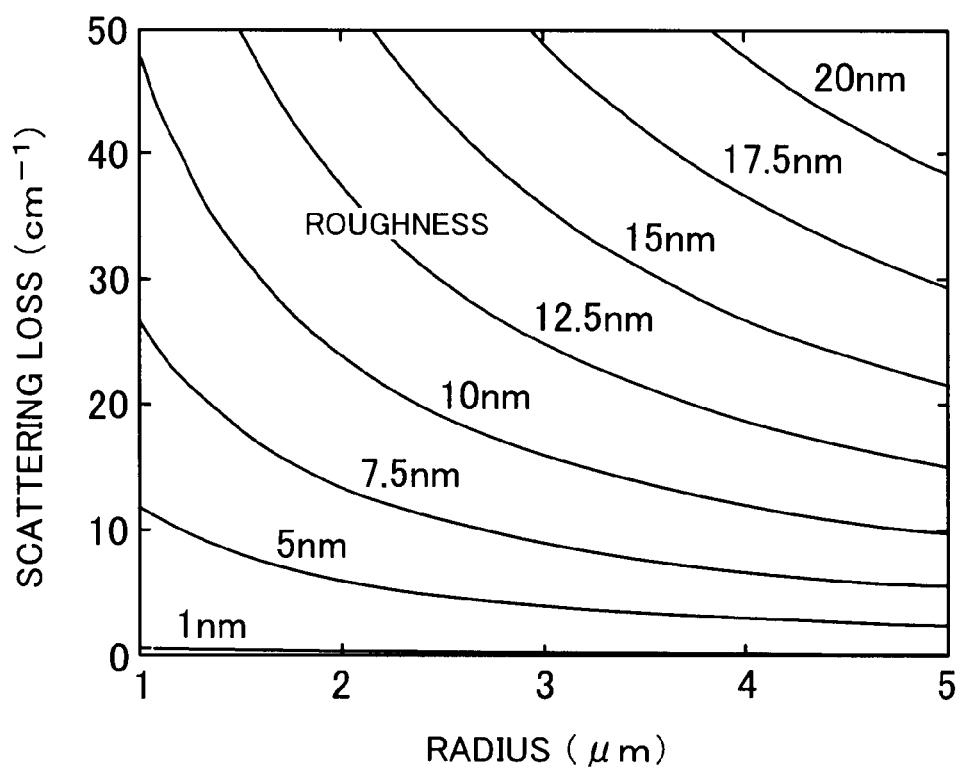
FIG. 2 is a figure showing relationship between the radius of the semiconductor laser and scattering loss according to the first embodiment.

FIG. 2 is a figure showing relationship between scattering loss and the roughness of the sidewall of the ring-shaped semiconductor layer. In FIG. 2, the horizontal axis represents the radius of the ring of the semiconductor layer. The vertical axis represents the scattering loss. The roughness is a parameter. The unit of the roughness is root mean square (RMS).

As shown in FIG. 2, the smaller the radius of the ring is, the more rapidly the scattering loss increases. The higher the roughness is, the more rapidly the scattering loss increases. In general, the scattering loss is inversely proportional to the radius of the ring, and is proportional to a square of the roughness.

For example, when the radius of the ring is 5 μm, the roughness is preferably 5 nm or less in order to reduce the scattering loss to 1 $cm^{-1}$ or less, which is needed for laser oscillation.

When the ring-shaped semiconductor layer is formed by reactive ion etching (RIE) method, the sidewall of the semiconductor layer is made into a rough surface, which causes roughness of about 10 nm, for example. Further, damages such as microcrack and crystal defect are caused by shock of ions.

However, the outer peripheral sidewalls and the inner peripheral sidewalls of the first and second cladding layers 14a, 14b are thermally oxidized to form the modified layers 14c, 14d. Thus, the roughness and the damage of an interface between the first and second cladding layers 14a, 14b and the modified layers 14c, 14d can be sufficiently reduced.

The amount of thermal oxidization needs to be more than the depth of penetration of the damage, and needs to be such a value that the desired roughness can be obtained.

Further, in the current confinement structure, the current is selectively injected into the active layer portion where the circulating mode is present. Therefore, the current injection portion is the same as the light intensity distribution, and this increases the gain in the circulating mode formed in the resonator.

The injected current does not flow in proximity to the outer peripheral sidewalls and the inner peripheral sidewalls. Therefore, it is possible to avoid the loss of carriers affected by the damage of the outer peripheral sidewalls and the inner peripheral sidewalls. For example, it is possible to avoid nonradiative recombination caused by surface recombination and nonradiative center due to the damage. As a result, the injection current can be effectively used.

The second electrode 19 is formed such that the second electrode 19 is displaced to the inner side from the center of the second cladding layer 14b. The optical absorption loss caused by the second electrode 19 can be reduced.

Figure 3:
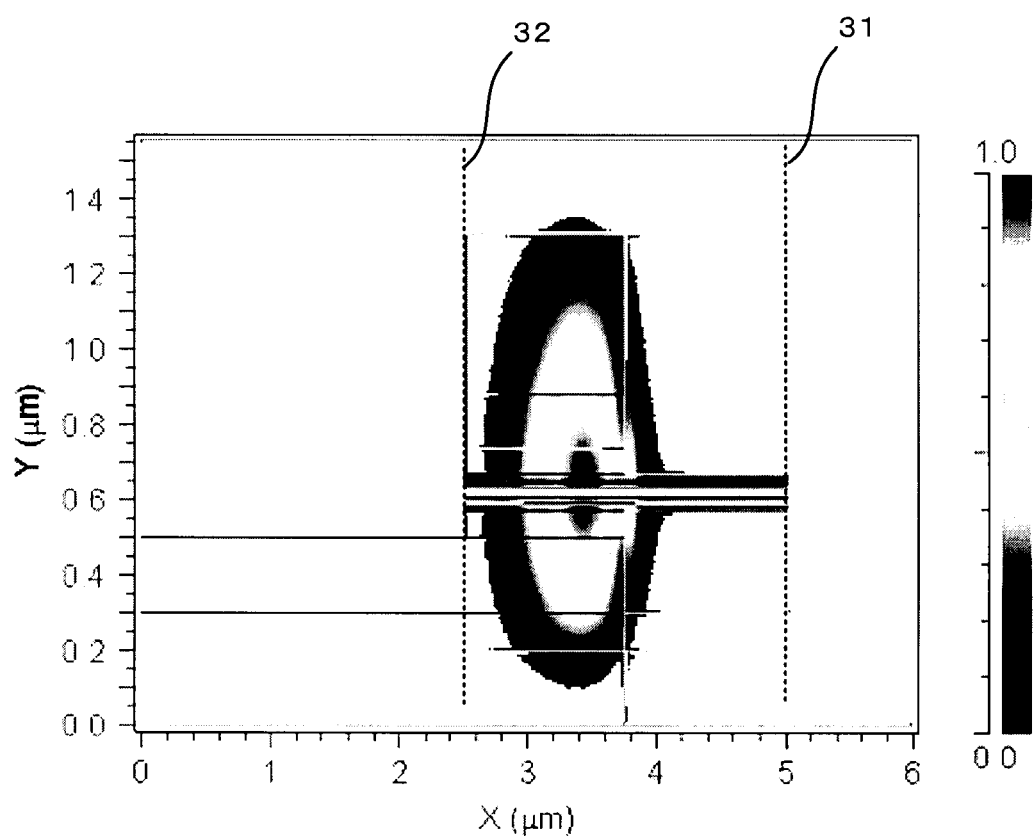
FIG. 3 is a figure showing a light intensity distribution of the semiconductor laser according to the first embodiment.

FIG. 3 is a figure showing a simulation result of a light intensity distribution of the semiconductor laser 10. The light intensity distribution represents a light intensity distribution in a cross section of the semiconductor layer 11 in the circulating mode.

As shown in FIG. 3, light hardly exists in proximity to an outer peripheral sidewall 31 and an inner peripheral sidewall 32 of the ring-shaped semiconductor layer 11, and the circulating mode is formed between the outer peripheral sidewall 31 and the inner peripheral sidewall 32. This proves that the outer peripheral sidewall 31 and the inner peripheral sidewall 32 reduce the scattering loss of light.

Figure 4:
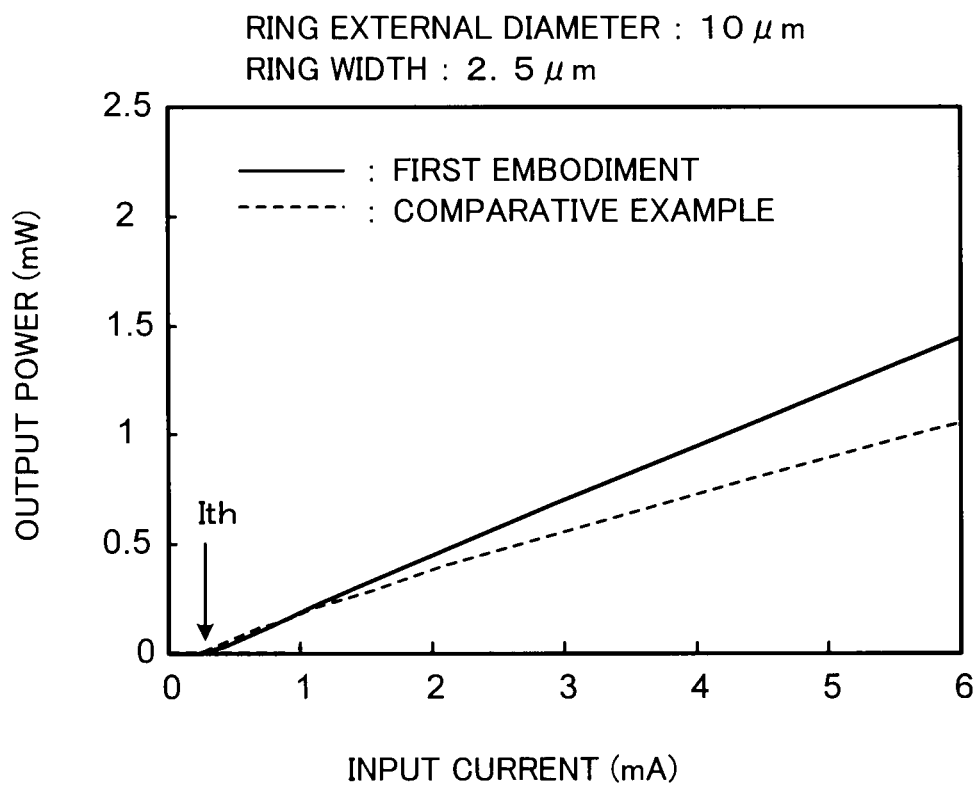
FIG. 4 is a figure showing light output characteristic according to the first embodiment.

FIG. 4 is a figure showing the oscillation characteristic of the semiconductor laser 10 as compared with a comparative example. In this case, the comparative example means a semiconductor laser in which the outer peripheral sidewalls and the inner peripheral sidewalls of the first and second cladding layers 14a, 14b are not modified into the modified layers 14c, 14d. First, the comparative example will be explained.

As shown in FIG. 4, the semiconductor laser of the comparative example has a laser oscillation threshold Ith of about 0.3 mA, and the gradient of the light output thereof tends to decrease when the input current is around 2 mA. An average light output characteristic was about 0.19 mW/mA.

On the other hand, the semiconductor laser 10 of the embodiment has a laser oscillation threshold Ith of about 0.3 mA, which is about the same as the comparative example. However, the light output linearly increases with respect to the input current. A light output characteristic was about 0.26 mW/mA, which was about 1.36 times higher than the comparative example. Therefore, it is confirmed that we have successfully obtained the small semiconductor laser 10 having the circular external shape and having the sufficient laser oscillation characteristic.

Subsequently, a method for producing the semiconductor laser 10 will be explained. FIGS. 5A to 8B are cross sectional views showing steps for manufacturing the semiconductor laser 10 in order.

Figure 5A:
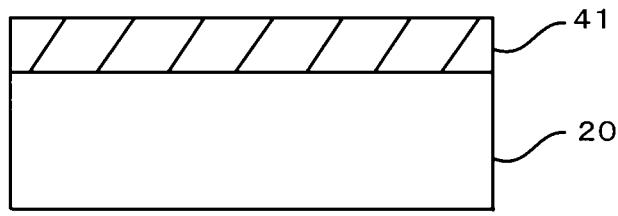
FIGS. 5A to 8B are a cross sectional views showing steps for manufacturing the semiconductor laser in order according to the first embodiment.

As shown in FIG. 5A, a silicon oxide film 41 having a thickness of about 2000 nm is formed on the semiconductor substrate 20 such as a silicon substrate by chemical vapor deposition (CVD) method, for example. The silicon oxide film 41 is a film serving as a portion of the cladding layer 22 of the optical waveguide.

Figure 5B:
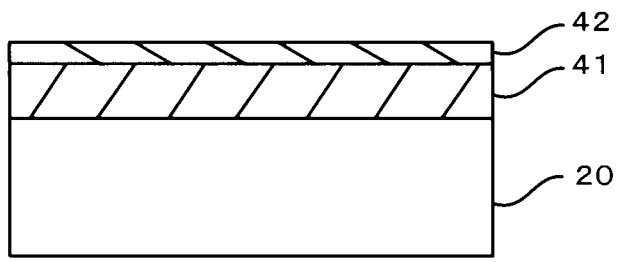

As shown in FIG. 5B, a silicon layer 42 having a thickness of about 300 nm is formed on the silicon oxide film 41 by CVD method, for example.

Figure 5C:
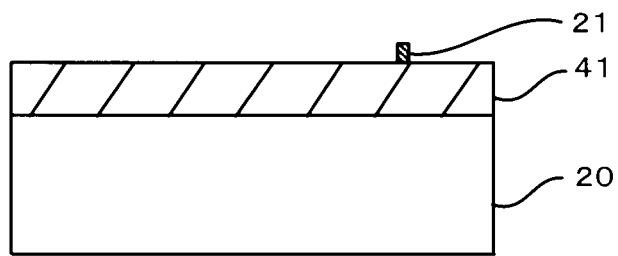

As shown in FIG. 5C, the silicon layer 42 is processed into a ridge shape having a width of about 300 nm for example, by photolithography method and RIE method. The ridge-shaped silicon layer 42 is the optical waveguide 21.

More specifically, this is performed as follows, for example. The silicon layer 42 is oxidized by heat, thus forming a thin silicon oxide film. A resist film having a pattern corresponding to the optical waveguide 21 is formed on the oxidized film by photolithography. Using the resist film as a mask, the silicon layer 42 is anisotropically etched by RIE method.

Figure 5D:
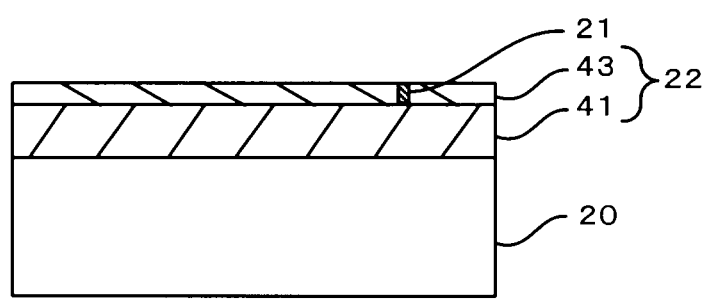

As shown in FIG. 5D, a silicon oxide film 43 having a thickness of about 2 μm is formed on the silicon oxide film 41 by CVD method, so that the optical waveguide 21 is embedded in the silicon oxide film 43. The silicon oxide film 43 is removed until the optical waveguide 21 is exposed by chemical mechanical polishing (CMP) method.

At this occasion, no stopper layer is provided for CMP. Therefore, the silicon layer 42 and the silicon oxide film 43 are preferably formed somewhat thickly in advance, so that the thicknesses thereof are adjusted to a predetermined thickness by means of remaining thickness management. Upon this step, the silicon oxide films 41, 43 are unified into the cladding layer 22 for the optical waveguide 21.

Figure 6A:
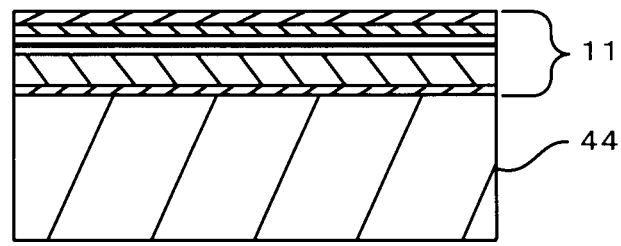

As shown in FIG. 6A, a semiconductor substrate 44 is prepared. The semiconductor substrate 44 has a semiconductor multi-layer structure, which is to be the semiconductor layer 11. More specifically, the semiconductor substrate 44 is formed as follows.

First, an N-type GaAs buffer layer having a thickness of 0.5 μm and an N-type AlGaAs etching stop layer having a thickness of 0.1 μm are formed on an N-type GaAs substrate by metal organic chemical vapor deposition (MOCVD) method, for example.

Subsequently, an N-type GaAs contact layer having a thickness of 0.01 μm, an N-type $Al_{0.92}Ga_{0.08}As$ cladding layer, an N-type GaAs light confinement layer, an undoped multiple quantum well active layer, a P-type GaAs light confinement layer, a P-type $Al_{0.92}Ga_{0.08}As$ cladding layer, and an N-type GaAs contact layer having a thickness of 0.01 μm are formed in this order.

In this case, the multiple quantum well active layer is structured by alternately depositing three layers of an N-type GaAs quantum well layer having a thickness of 8 nm and a GaAs barrier layer having a thickness of 10 nm, and sandwiching the upper and lower sides thereof with $Al_{0.1}Ga_{0.9}As$ layers having a thickness of 40 nm.

An AlGaAs graded layer may be inserted between the GaAs contact layer and the cladding layer and between the cladding layer and the undoped multiple quantum well active layer. The Al composition in the AlGaAs graded layer gradually changes from 0.1 to 0.92.

Figure 6B:
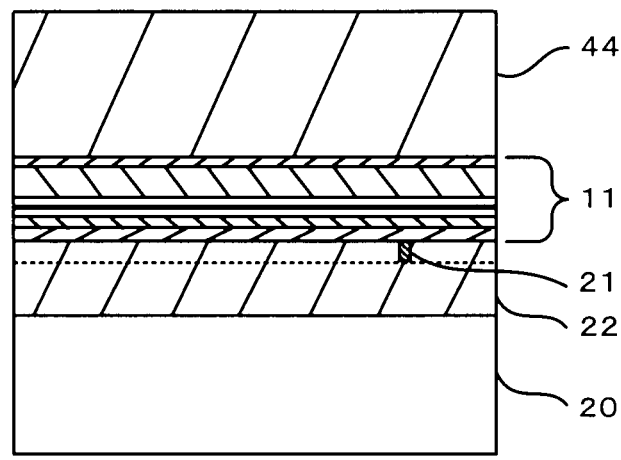

As shown in FIG. 6B, the surfaces of the semiconductor layer 11 and the cladding layer 22 including the optical waveguide 21 are activated by plasma treatment, for example. Thereafter, the semiconductor substrate 44 is reversed, and the semiconductor layer 11 and the cladding layer 22 including the optical waveguide 21 are brought into contact with each other, so that the semiconductor substrate 20 and the semiconductor substrate 44 are directly bonded by thermal process in inactive gas.

Figure 6C:
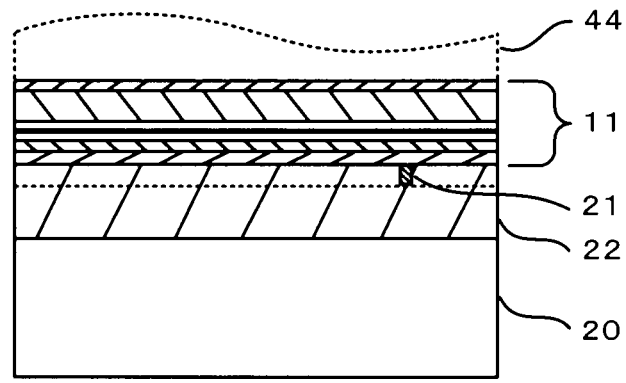

As shown in FIG. 6C, the semiconductor substrate 44 and the buffer layer are removed by wet etching, so that the etching stop layer is exposed. Further, the etching liquid is exchanged to remove the exposed etching stop layer. As a result, the semiconductor layer 11 remains on the cladding layer 22 including the optical waveguide 21.

Figure 7A:
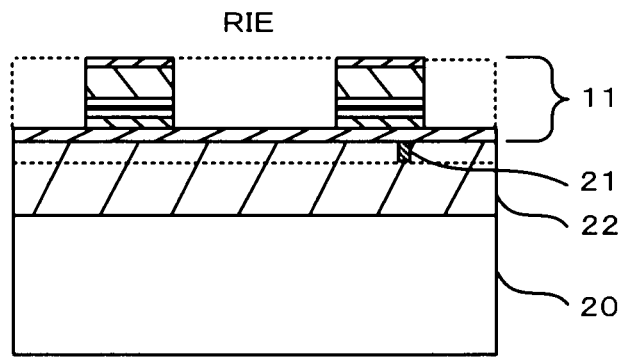

As shown FIG. 7A, the semiconductor layer 11 is processed in a ring shape. More specifically, the semiconductor layer 11 is processed as follows. A ring-shaped mask material (not shown) having an outer diameter of 10 μm and an internal diameter of 5 μm is formed by photolithography method, and the semiconductor layer 11 is anisotropically etched until the first contact layer 15a is exposed by RIE method using the mask material.

Figure 7B:
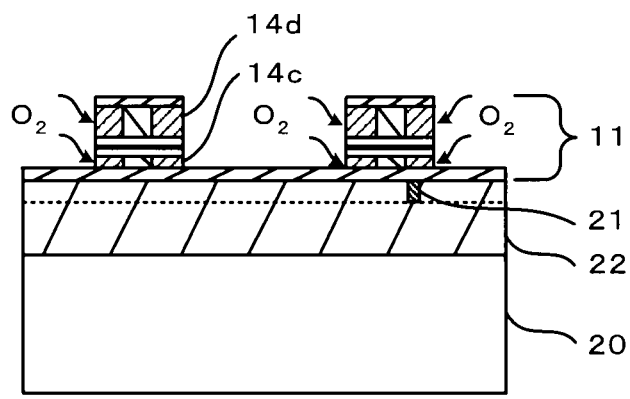

As shown in FIG. 7B, the semiconductor substrate 20 directly bonded with the semiconductor layer 11 is subjected to oxidization treatment. The oxidization treatment is performed in a water vapor atmosphere, in an oxygen atmosphere, or in an air atmosphere at a temperature of 400 degrees Celsius to 500 degrees Celsius, for example.

At this occasion, the oxidization rate is determined by the Al composition ratio. The first and second cladding layers 14a, 14b having a high Al composition ratio are selectively oxidized. Accordingly, the outer peripheral sidewalls and the inner peripheral sidewalls of the first and second cladding layers 14a, 14b are modified into the first and second modified layers 14c, 14d. At the same time, the current confinement structure is formed.

In many cases, the oxidization rates are different in accordance with crystal surface orientations. On (100) plane, the oxidization rate is the lowest. The oxidization rate is higher on (110) plane, and is still much higher on (111) plane.

As a result, in the outer peripheral sidewalls and the inner peripheral sidewalls of the ring-shaped first and second cladding layers 14a, 14b, the widths of the modified layers are different according to the surface orientations. The widths are more greatly affected when the outer diameter of the semiconductor layer 11 is smaller. Therefore, it is preferable that the external shape of the unmodified semiconductor layer is appropriately defined so that the semiconductor layer is made into a desired circular shape after the modifying.

Figure 7C:
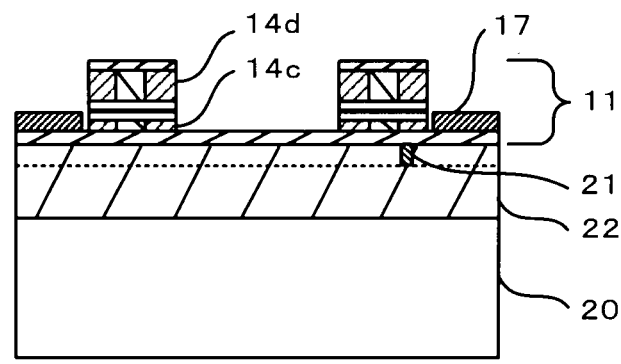

As shown in FIG. 7C, the ring-shaped first electrode 17 concentric with the semiconductor layer 11 is formed on the first contact layer 15a.

Figure 8A:
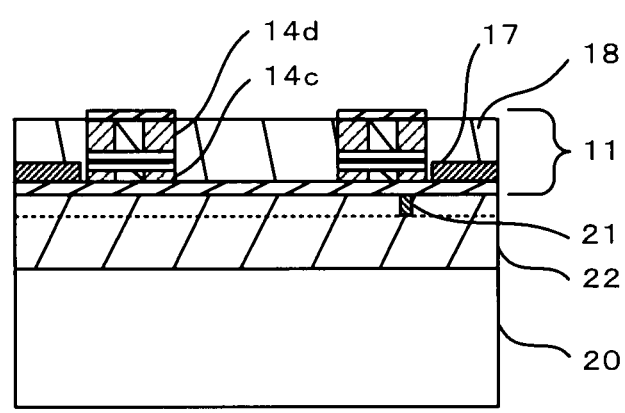

As shown in FIG. 8A, the insulating film 18, i.e., a silicon oxide film, is formed by CVD method, for example. The semiconductor layer 11 and the first electrode 17 are embedded in the insulating film 18. The silicon oxide film is removed by CMP method until the second contact layer 15b is exposed.

Figure 8B:
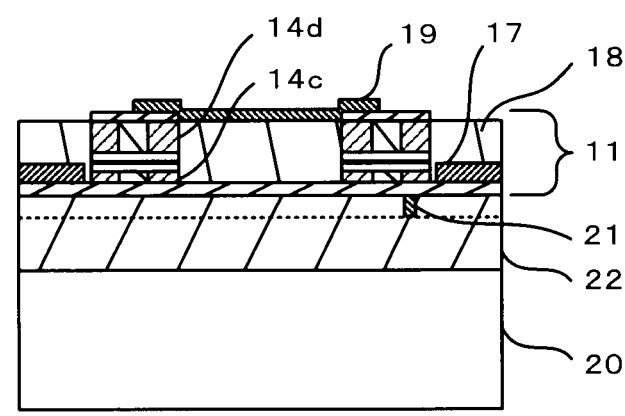

As shown in FIG. 8B, the discoidal second electrode 19 is formed on the inner peripheral portion of the upper surface of the exposed second contact layer 15b and the insulating film 18 in which the inner side of the semiconductor layer 11 is embedded.

As a result, the semiconductor layer 11 is optically coupled with the optical waveguide 21 provided on the semiconductor substrate 20 as shown in FIG. 1. Thus, the semiconductor laser 10 mounted on the semiconductor substrate 20 is obtained.

As described above, in the semiconductor laser 10 of the embodiment, the outer peripheral sidewalls and the inner peripheral sidewalls of the first and second cladding layers 14a, 14b are selectively modified, whereby the first and second modified layers 14c, 14d are formed.

The first and second modified layers 14c, 14d have a refractive index lower than the refractive indexes of the first and second cladding layers 14a, 14b, and have smooth interfaces which are free from damage caused by the processing. As a result, the optical resonator reduces the light loss caused by scattering occurring at the sidewalls, and also reduces the carrier loss caused by interface trap level and interface recombination.

Further, the first and second modified layers 14c, 14d have an electrical insulating property, which forms the current confinement structure at the same time. As a result, a current can be selectively injected into an area of the active layer where the circulating mode is present, and this increases the gain in the circulating mode. Therefore, we have successfully obtained the semiconductor laser having the circular external shape and having the sufficient laser oscillation characteristic.

Figure 9:
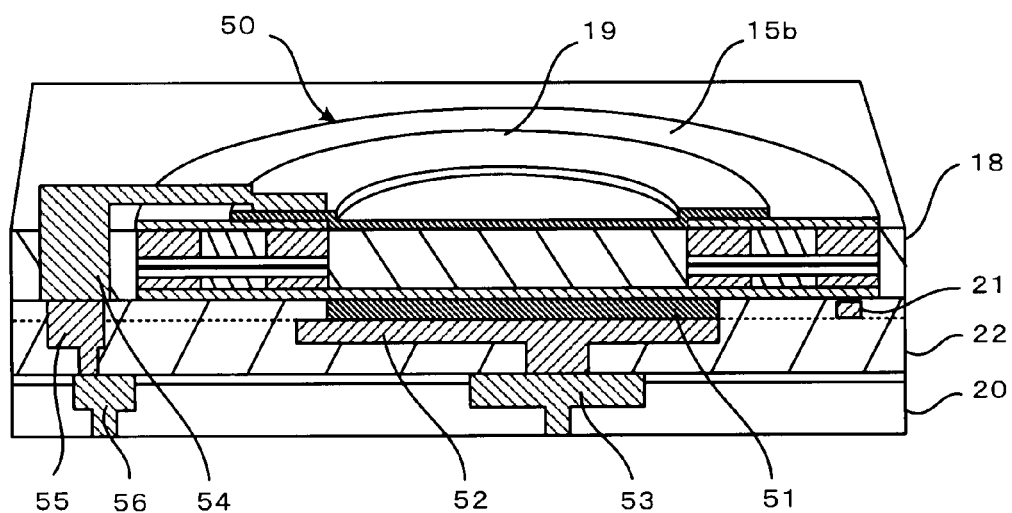
FIGS. 9 to 11 are cross sectional perspective views showing another semiconductor laser to the first embodiment.

In this explanation, the first and second electrodes 17, 19 are connected to the surface of the semiconductor layer 11. Alternatively, the first and second electrodes 17, 19 can be connected to the surface of the semiconductor substrate 20. FIG. 9 is a cross sectional perspective view showing another semiconductor laser in which the first and second electrodes are connected to the surface of the semiconductor substrate 20.

As shown in FIG. 9, in a semiconductor laser 50, a first electrode 51 is embedded in a cladding layer 22, and is formed on a side of a first contact layer 15a facing a semiconductor substrate 20. The first electrode 51 is connected to a contact metal 52 embedded in the cladding layer 22, which is connected to a via 53 penetrating through the semiconductor substrate 20, and the via 53 is exposed on the surface of the semiconductor substrate 20.

A second electrode 19 is connected to a cantilevered metal post 54 protruding through an insulating film 18, and the cantilevered metal post is connected to a contact metal 55 embedded in the cladding layer 22. The contact metal 55 is connected to a via 56 penetrating through the semiconductor substrate 20, and the via 56 is exposed on the surface of the semiconductor substrate 20.

This structure has an advantage in that the semiconductor laser 50 can be mounted on a wiring substrate using a flip chip technique.

Figure 10:
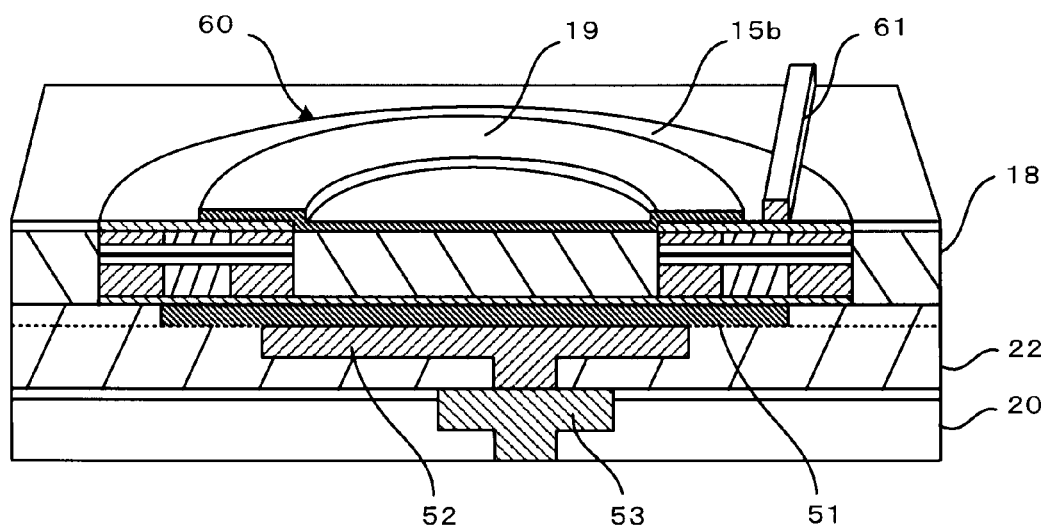

In the above explanation, the semiconductor laser 10 is optically coupled with the optical waveguide 21 provided on the semiconductor substrate 20. Alternatively, the semiconductor laser 10 may be optically coupled with an optical waveguide provided on the surface of the semiconductor laser. FIG. 10 is a cross sectional perspective view showing another semiconductor laser in which a semiconductor laser is optically coupled with an optical waveguide provided on the surface of the semiconductor laser.

As shown in FIG. 10, a semiconductor laser 60 has an optical waveguide 61 provided on the surface of the semiconductor laser 60. After a semiconductor layer 11 is processed into a ring shape, the ring-shaped semiconductor layer 11 is embedded into a silicon oxide film, and the optical waveguide 61 is formed in the silicon oxide film.

An active layer 12 of the semiconductor layer 11 is formed in such a manner that the active layer 12 is shifted to the side of the optical waveguide 61, such that the distance between the active layer 12 and the optical waveguide 61 is substantially the same as the distance between the active layer 12 and the optical waveguide 21 in the semiconductor laser 10.

This structure has an advantage in that a light output can be distributed to the two optical waveguides provided at the upper and lower sides of the semiconductor laser.

Figure 11:
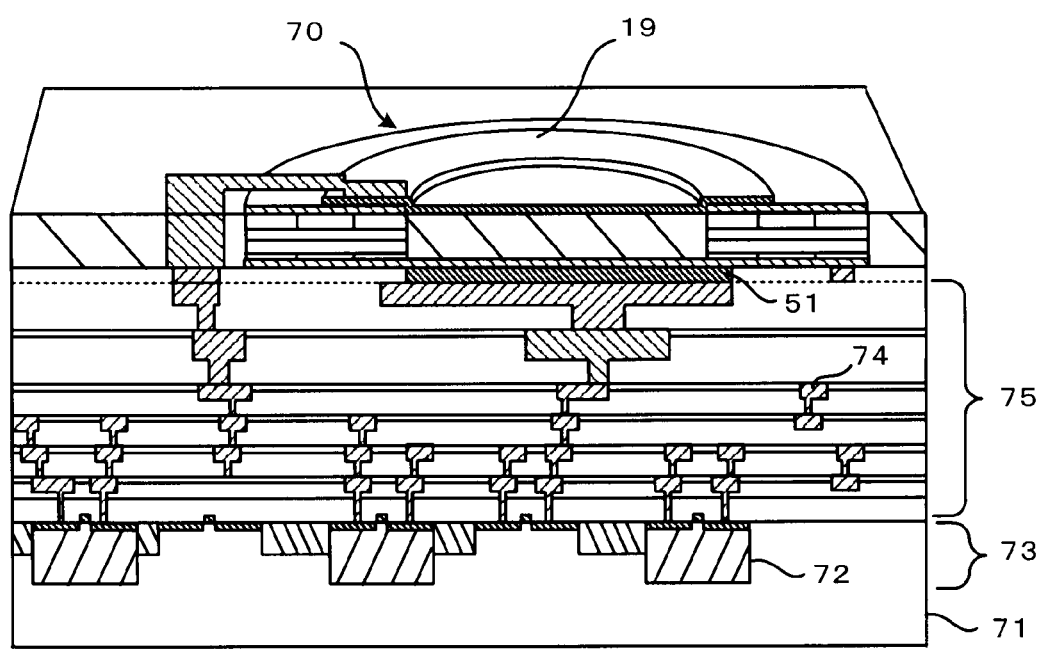

In the above explanation, the semiconductor laser 10 is mounted on the semiconductor substrate 20 having no devices formed thereon. However, the semiconductor laser 10 may be mounted on the semiconductor substrate having devices formed thereon. FIG. 11 is a cross sectional perspective view showing a semiconductor laser mounted on a semiconductor substrate having devices formed thereon.

As shown in FIG. 11, a transistor layer 73 having a plurality of transistors 72 such as CMOS transistors is formed on a semiconductor substrate 71. A metal wiring layer 75 having a plurality of metal wirings 74 is formed on the semiconductor substrate 71. In a semiconductor laser 70, first and second electrodes 51, 19 are connected to the surface facing the semiconductor substrate 71, and the semiconductor laser 70 is mounted on the semiconductor substrate 71.

A silicon-on-insulator (SOI) substrate may be used as the semiconductor substrate 20 having the optical waveguide 21 provided thereon. In this case, the embedded insulating film ($SiO_2$) of the SOI substrate is used as a portion of the clad layer 22, and the optical waveguide 21 may be formed by processing the silicon layer of the SOI substrate into a stripe form.

The active layer 12 may be a GaInNAs multiple quantum well layer on a GaAs substrate, an AlGaInAs multiple quantum well layer on an InP substrate, an AlGaAsSb multiple quantum well layer on a GaSb substrate, an InGaAlP multiple quantum well layer on a GaAs substrate, an InGaN multiple quantum well layer on a GaN substrate, and the like.

The shape of the ring is not limited to the circular shape. Alternatively, it may be an elliptic shape, a shape made of a combination of lines and curves, and the like. Each of the width of the optical waveguide 21 and the perimeter of the ring shape may be set at any value, and may be selected in accordance with the purpose.

The semiconductor laser has an N-up structure in which the first electrode is the negative electrode, and the second electrode is the positive electrode. However, the semiconductor laser is not limited to the N-up structure. The semiconductor laser may have a P-up structure in which the first electrode is the positive electrode, and the second electrode is the negative electrode.

Second Embodiment

Figure 12:
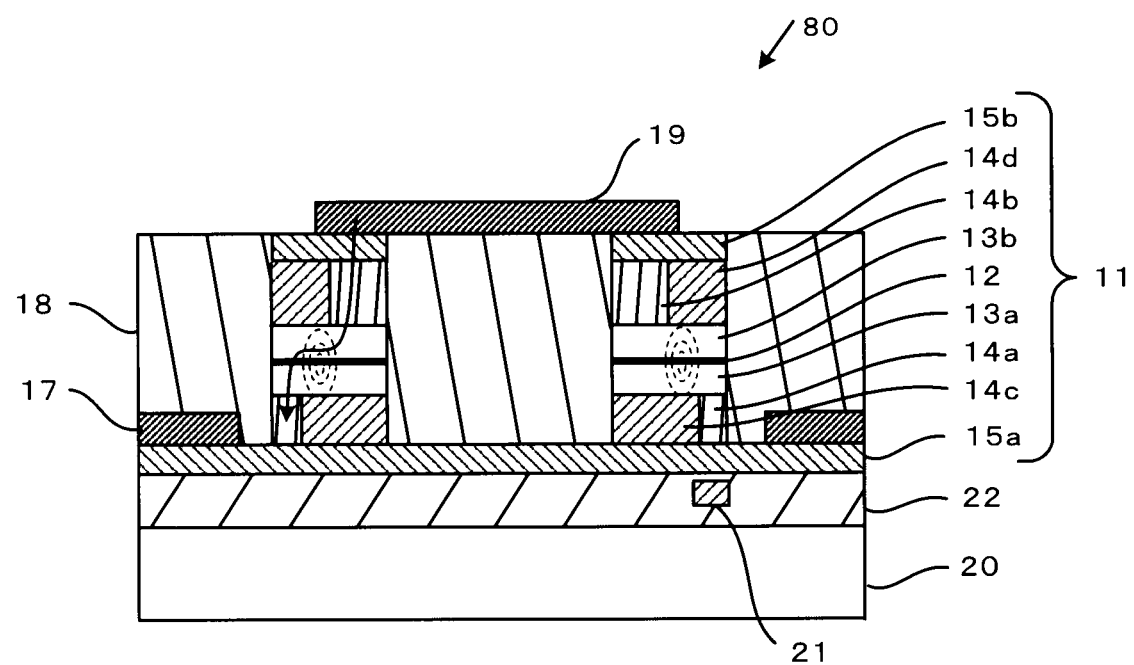
FIG. 12 is a cross sectional perspective view showing a semiconductor laser according to a second embodiment.

A semiconductor laser of a second embodiment will be explained with reference to FIG. 12. FIG. 12 is a cross sectional view showing a semiconductor laser of the embodiment. In this embodiment, the same constituent portions as those of the first embodiment are denoted with the same reference numerals, and description thereabout is not repeated here. Only different portions will be explained. This embodiment is different from the first embodiment in that the inner peripheral sidewall of the first cladding layer is selectively modified, and the outer peripheral sidewall of the second cladding layer is selectively modified.

In other words, in a semiconductor laser 80 of the embodiment, the inner peripheral sidewall of the ring of the first cladding layer 14a is oxidized by heat as shown in FIG. 12, so that the inner peripheral sidewall is modified into a modified layer 14c with a refractive index lower than the refractive indexes of the first cladding layer 14a. Therefore, in the first cladding layer 14a, the outer peripheral portion except for the modified layer 14c of the inner peripheral portion functions as the original first cladding layer.

On the other hand, the outer peripheral sidewall of the ring of the second cladding layer 14b is oxidized by heat, so that the outer peripheral sidewall is modified into a modified layer 14d with a refractive index lower than the refractive indexes of the second cladding layer 14b. Therefore, in the second cladding layer 14b, the inner peripheral portion except for the modified layer 14d of the outer peripheral portion functions as the original second cladding layer.

The first and second modified layers 14c, 14d overlap with each other so as to sandwich an active layer 12. Thus, a current confinement structure is formed, in which a current flows into the active layer 12 from the inner peripheral side, the current flows in the horizontal direction along the active layer 12, and the current flows out from the outer peripheral side. In the side injection method in which the current flows along the active layer 12 in the horizontal direction, the light can be strongly confined in the central portion.

Figure 13:
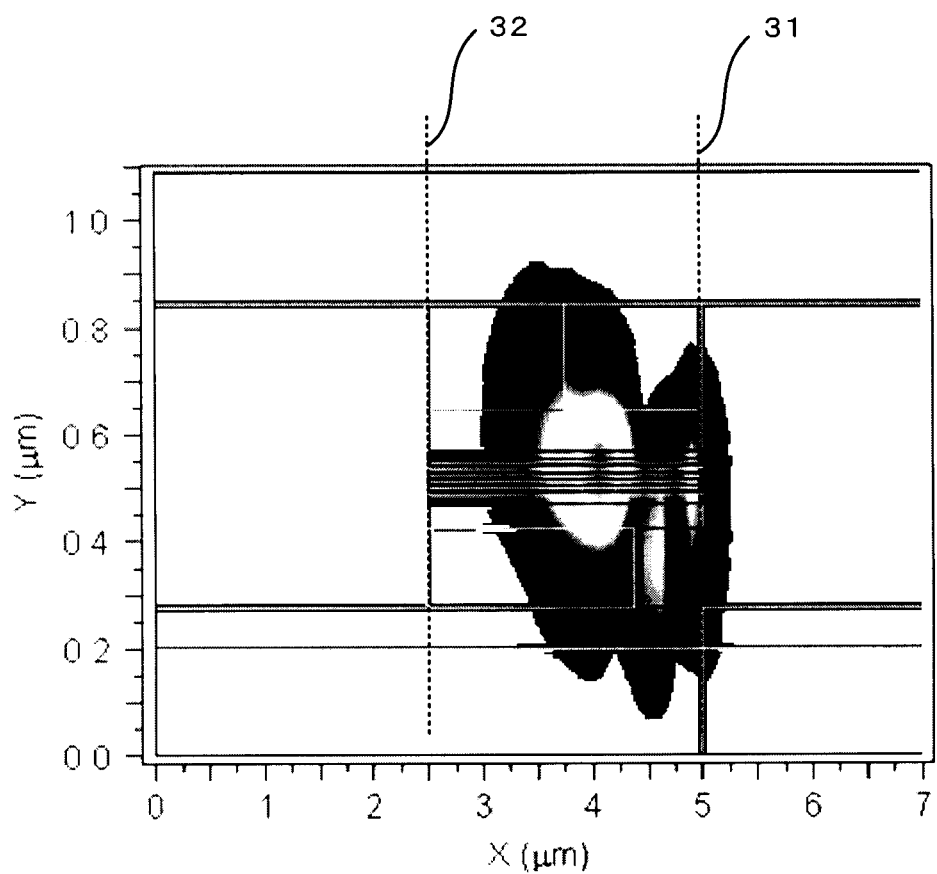
FIG. 13 is a figure showing a light intensity distribution of the semiconductor laser according to the second embodiment.

FIG. 13 is a figure showing a simulation result of a light intensity distribution of the semiconductor laser 80. The light intensity distribution represents a light intensity distribution in a cross section of a semiconductor layer 11 in a circulating mode.

It is confirmed that the majority of light is strongly confined in the central portion of the active layer 12 in which the confined current flows in the horizontal direction.

Further, it is confirmed that a portion of light leaks out of the cladding layer 22 from a lower surface of the ring-shaped semiconductor layer 11, and therefore, an optical-coupling efficiency with the optical waveguide 21 is improved by appropriately arranging the optical waveguide 21. This makes it easy to retrieve light into the optical waveguide 21.

Figure 14:
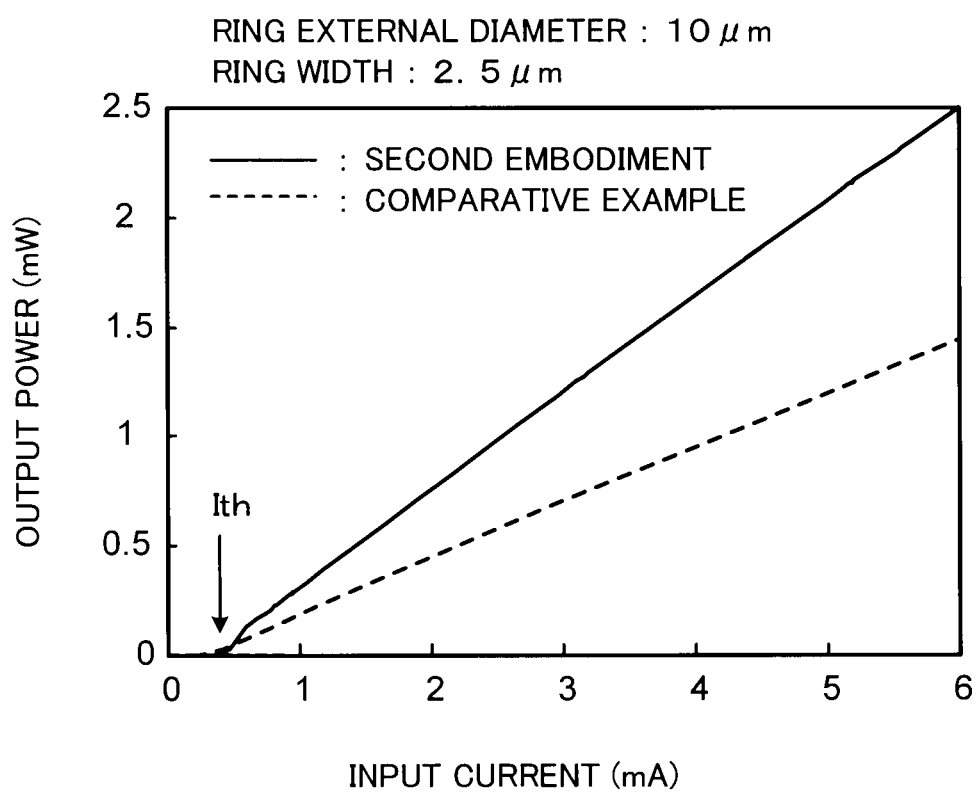
FIG. 14 is a figure showing light output characteristic according to the second embodiment.

FIG. 14 is a figure showing an oscillation characteristic of the semiconductor laser 80 as compared with a comparative example. In this case, the comparative example means the semiconductor laser 10 as shown in the first embodiment.

As shown in FIG. 14, the semiconductor laser 80 of the embodiment has a laser oscillation threshold Ith of about 0.3 mA, which is about the same as the comparative example. However, the light output linearly increases with respect to the input current. A light output characteristic was about 0.42 mW/mA, which was about 1.6 times higher than the comparative example. Therefore, it is confirmed that we have successfully obtained the semiconductor laser having still more sufficient laser oscillation characteristic.

Subsequently, a method for manufacturing the semiconductor laser 80 will be explained. FIGS. 15A to 17B are cross sectional views showing steps for manufacturing the semiconductor laser 80 in order.

In accordance with the steps as shown in FIGS. 5A to 6C, the semiconductor layer 11 is formed on the cladding layer 22 including the optical waveguide 21.

Figure 15A:
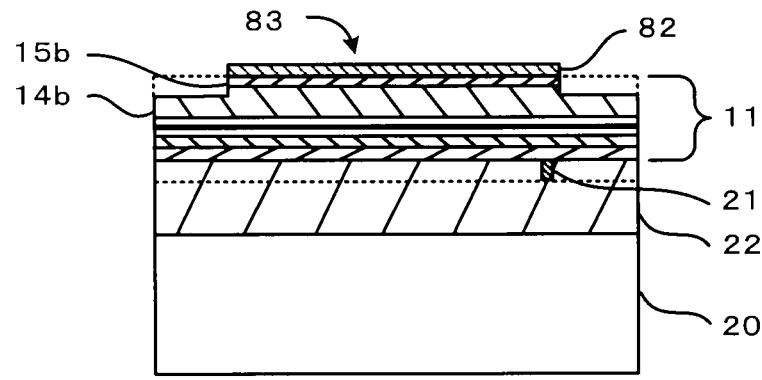
FIGS. 15A to 17B are a cross sectional views showing steps for manufacturing the semiconductor laser in order according to the second embodiment.

As shown in FIG. 15A, a circular mask material 82 having a diameter of about 10 μm is formed on the second contact layer 15b of the semiconductor layer 11. The mask material 82 is a silicon oxide film or a silicon nitride film made by CVD method, for example.

Using the mask material 82, the semiconductor layer 11 is anisotropically etched to some depth of the second cladding layer 14b by RIE method, for example, so that a discoidal protruding portion 83 is formed. The outer periphery of the protruding portion 83 corresponds to the outer periphery of the ring-shaped semiconductor layer 11.

Figure 15B:
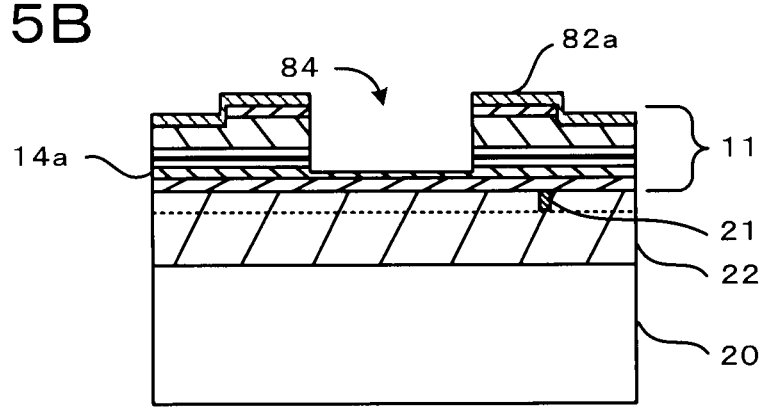

As shown in FIG. 15B, after the mask material 82 is once removed, a mask material 82a is formed so as to cover the second cladding layer 14b exposed again and the upper surface and the side surface of the protruding portion 83. In other words, the mask material 82a is formed in a conformal manner. An opening is formed in the mask material 82a. The opening is concentric with the outer periphery of the protruding portion 83, and the opening has a diameter of about 5 μm in the central portion of the protruding portion 83.

Using the mask material 82a, the semiconductor layer 11 is anisotropically etched to some depth of the first cladding layer 14a by RIE method, for example, so that a recessed portion 84 is formed. The inner periphery of the recessed portion 84 corresponds to the inner periphery of the ring-shaped semiconductor layer 11. In other words, the protruding portion 83 and the recessed portion 84 are formed in a concentric manner. Thus, the semiconductor layer 11 is processed into a ring shape in which the height of the outer peripheral sidewall is different from the height of the inner peripheral sidewall.

Figure 15C:
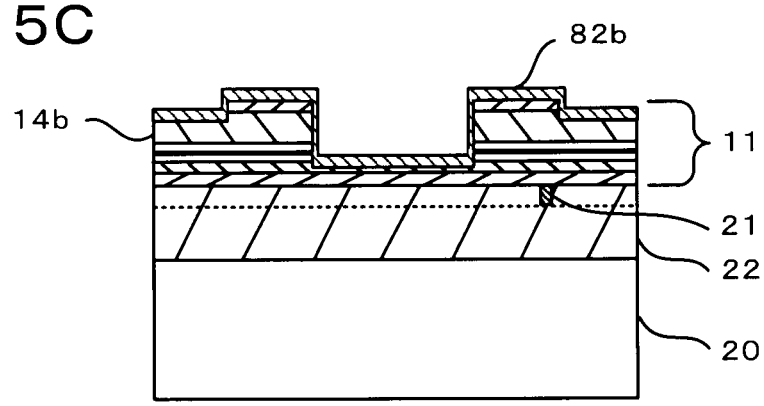

As shown in FIG. 15C, after the mask material 82a is once removed, a mask material 82b is formed so as to cover again the second cladding layer 14b, the upper surface and the side surface of the protruding portion 83, the bottom surface and the side surface of the recessed portion 84. In other words, the mask material 82b is formed in a conformal manner.

Figure 16A:
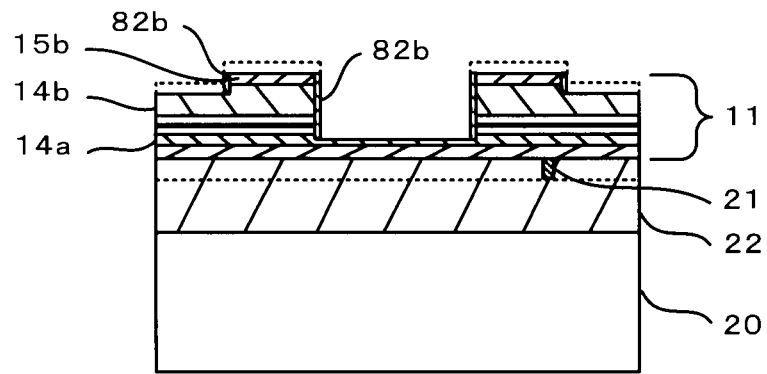

As shown in FIG. 16A, the mask material 82b is anisotropically etched by RIE method, for example, so as to remove the mask material 82b on the upper surface of the protruding portion 83 and the bottom surface of the recessed portion 84 but leaves the mask material 82b on the side surface of the protruding portion 83 and the side surface of the recessed portion 84. Thus, the second contact layer 15b and the upper surfaces of the first and second cladding layers 14a, 14b are exposed.

Figure 16B:
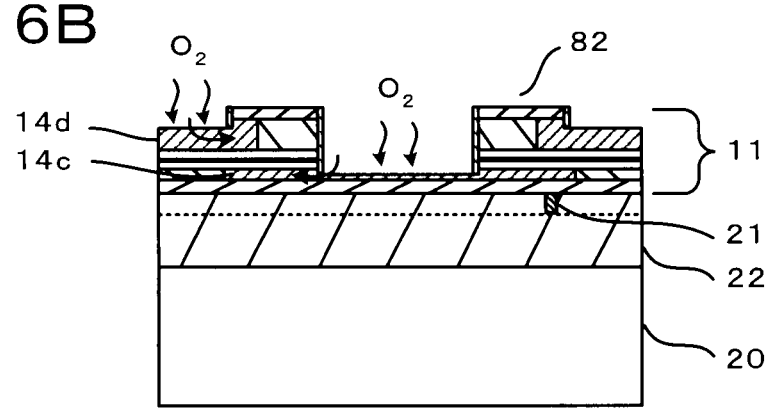

As shown in FIG. 16B, the upper surfaces of the first and second cladding layers 14a, 14b are selectively oxidized by heat first. Then, lower portions and side portions of the first and second cladding layers 14a, 14b are oxidized subsequently.

As a result, in the first cladding layer 14a, the inner peripheral sidewall is modified, whereby the first modified layer 14c is formed. In the second cladding layer 14b, the outer peripheral sidewall is modified, whereby the second modified layer 14d is formed. The active layer 12 is sandwiched by the electrically-insulating first and second modified layers 14c, 14d which overlap with each other, whereby the current confinement structure in the horizontal direction is formed.

Figure 16C:
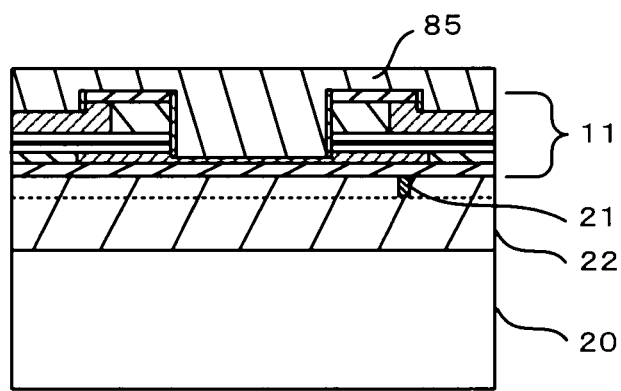

As shown in FIG. 16C, an insulating film 85, e.g., a silicon oxide film, is formed by CVD method, for example, so that the ring-shaped semiconductor layer 11 is embedded in the insulating film 85.

Figure 17A:
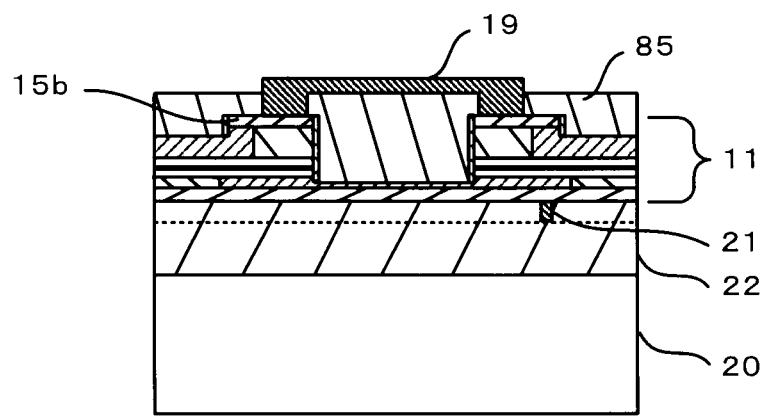

As shown in FIG. 17A, a ring-shaped opening is formed in the insulating film 85 on the second contact layer 15b, so that the second contact layer 15b is exposed. The second electrode 19 is formed on the insulating film 85 which fills the upper side of the second contact layer 15b and the inner side of the semiconductor layer 11.

Figure 17B:
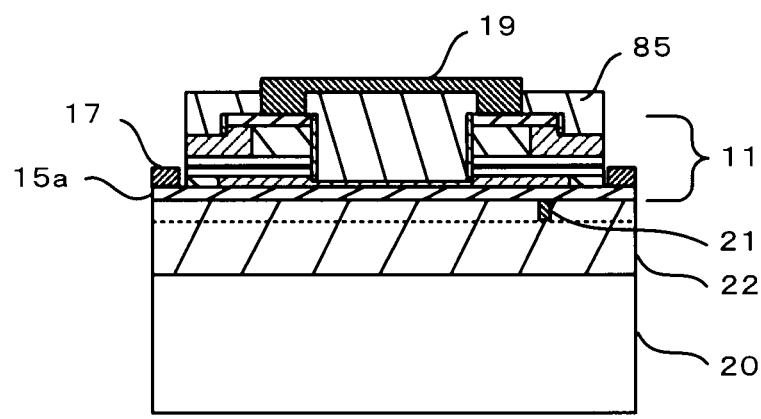

As shown in FIG. 17B, a ring-shaped opening is formed in the insulating film 85 at the outside of the semiconductor layer 11, so that the first contact layer 15a is exposed. The ring-shaped first electrode 17 concentric with the semiconductor layer 11 is formed on the first contact layer 15a.

Therefore, the semiconductor layer 11 is optically coupled with the optical waveguide 21 provided on the semiconductor substrate 20 as shown in FIG. 12, so that the semiconductor laser 80 mounted on the semiconductor substrate 20 can be obtained.

As described above, the semiconductor laser 80 of the embodiment is made as follows. In the first cladding layer 14a, the inner peripheral sidewall is modified, so that the first modified layer 14c is formed. In the second cladding layer 14b, the outer peripheral sidewall is modified, so that the second modified layer 14d is formed.

As a result, the active layer 12 is sandwiched by the electrically-insulating first and second modified layers 14c, 14d which overlap with each other, whereby the current confinement structure in the horizontal direction is formed. Thus, there is an advantage in that the laser oscillation characteristic can be further improved.

Figure 18:
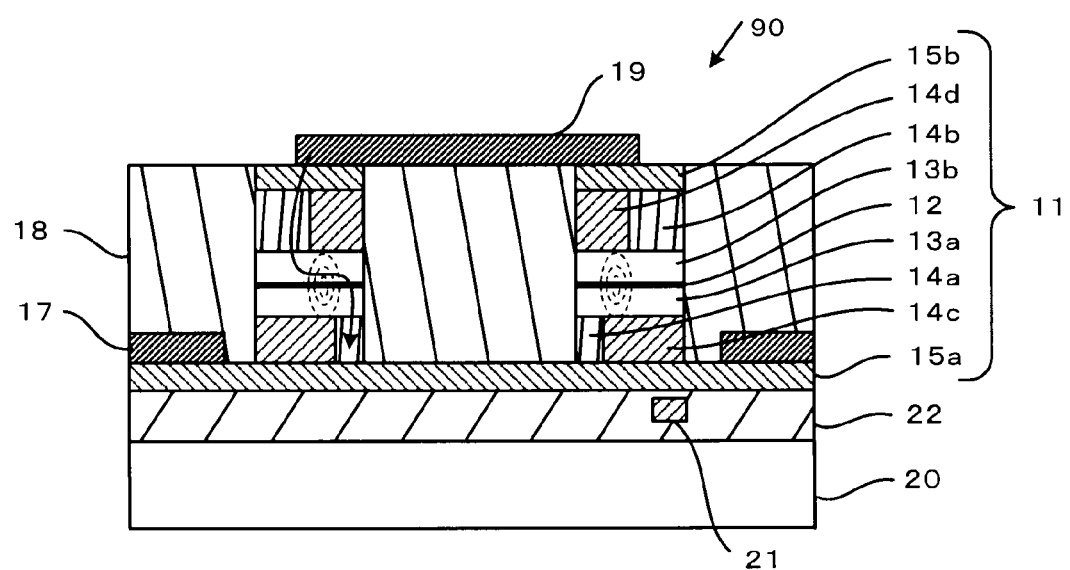
FIG. 18 is a cross sectional perspective view showing another semiconductor laser to the second embodiment.

In the above explanation, the inner peripheral sidewall of the first cladding layer 14a and the outer peripheral sidewall of the second cladding layer 14b are modified. Alternatively, the outer peripheral sidewall of the first cladding layer 14a and the inner peripheral sidewall of the second cladding layer 14b may be modified. FIG. 18 is a cross sectional view showing a semiconductor laser 90 in which the outer peripheral sidewall of the first cladding layer 14a and the inner peripheral sidewall of the second cladding layer 14b are modified.

In some cases, the materials of the first and second cladding layers are different, and it may be impossible to selectively modify the sidewall of the second cladding layer. However, the current confinement structure of the embodiment can be applied to even such cases.

An example of such cases includes a semiconductor layer including an InP (first contact layer), InAlAs (first cladding layer), InGaAsP (first light confinement layer), InGaAsP multiple quantum well (active layer), InGaAsP (second light confinement layer), InP (second cladding layer), and InGaAs (second contact layer). The InAlAs (first cladding layer) is selectively oxidized, but the InP (second cladding layer) is not selectively oxidized.

In this case, the outer peripheral portion of the InP (second cladding layer) is removed by etching in advance. The inner peripheral sidewall of the InAlAs (first cladding layer) is selectively modified in the step as shown in FIG. 16B. Thus, the current confinement structure in the horizontal direction can be formed. The InP (second cladding layer), from which the outer peripheral portion is removed in advance, can also be formed by selective growth.

Third Embodiment

Figure 19:
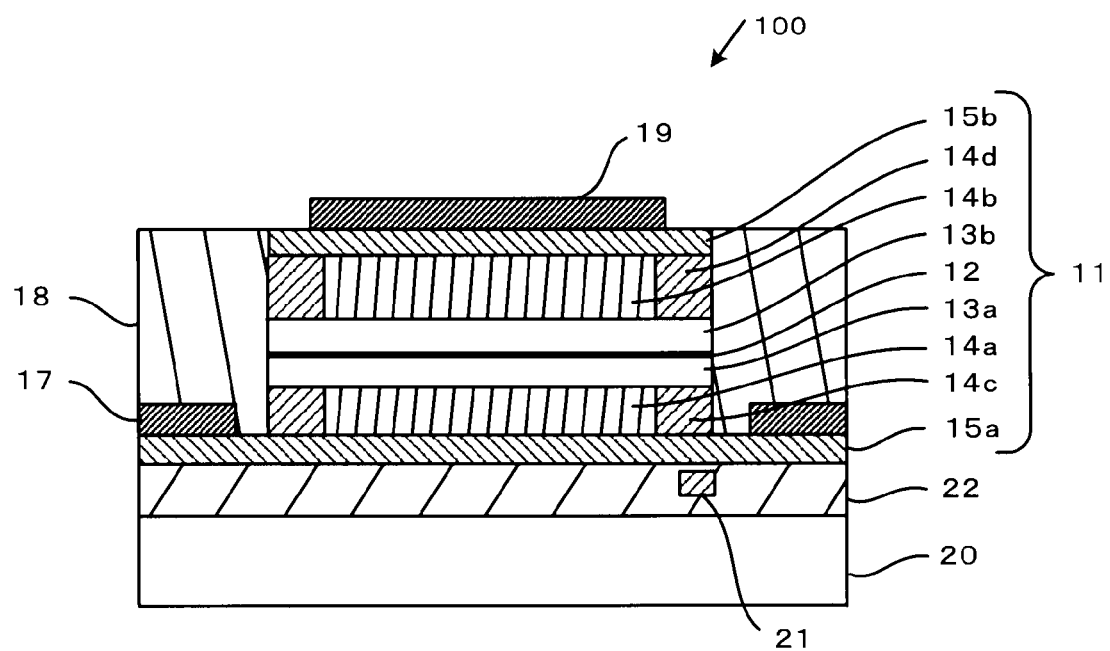
FIG. 19 is a cross sectional perspective view showing a semiconductor laser according to a third embodiment.

A semiconductor laser of a third embodiment will be explained with reference to FIG. 19. FIG. 19 is a cross sectional view showing the semiconductor laser of the embodiment. In this embodiment, the same constituent portions as those of the first embodiment are denoted with the same reference numerals, and description thereabout is not repeated here. Only different portions will be explained. This embodiment is different from the first embodiment in that a semiconductor layer is formed in a disk shape.

In other words, in a semiconductor laser 100 of the embodiment as shown in FIG. 19, a semiconductor layer 11 is in a disk shape. In the semiconductor laser 100, sidewalls of first and second cladding layers 14a, 14b are selectively oxidized, whereby first and second modified layers 14c, 14d are formed.

In the disk-shaped semiconductor laser 100, light circulates along the external periphery of the disk while the light is totally reflected by interfaces between the first and second cladding layers 14a, 14b and the first and second modified layers 14c, 14d. A second electrode 19 is formed in a central portion of a disk-shaped second contact 15b.

Therefore, like the semiconductor laser 10 of the first embodiment, the optical resonator reduces the light loss caused by scattering occurring at the sidewalls, and also reduces the carrier loss caused by interface trap level and interface recombination.

As explained above, in the semiconductor laser 100 according the embodiment, the sidewalls of the first and second cladding layers 14a, 14b are modified to make the first and second modified layers 14c, 14d. Thus, there is an advantage in that the semiconductor laser 100 can reduce carrier loss caused by light loss and damage due to the roughness of the sidewalls.

Figure 20:
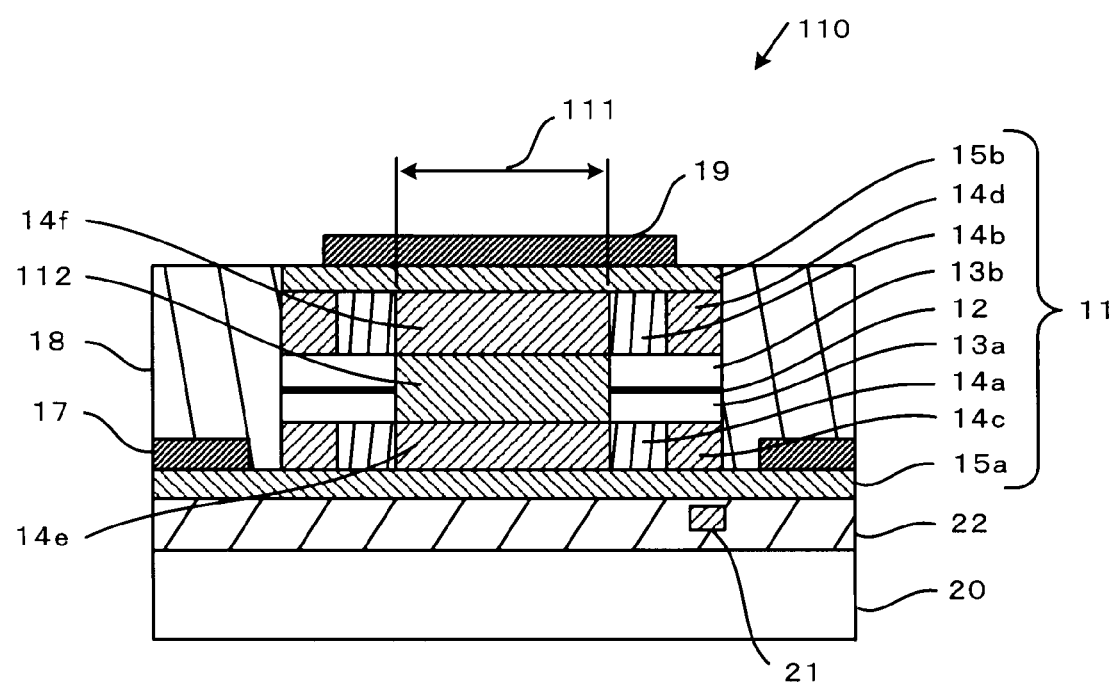
FIG. 20 is a cross sectional perspective view showing another semiconductor laser to the third embodiment.

Further, a current confinement structure can be added to the disk-shaped semiconductor laser 100. FIG. 20 is a cross sectional view showing a disk-shaped semiconductor laser including a current confinement structure.

As shown in FIG. 20, in a semiconductor laser 110, a central portion 111 of the first and second cladding layers 14a, 14b is modified into third and fourth modified layers 14e, 14f having an electrical insulating property.

The first cladding layer 14a is sandwiched between the first and third modified layers 14c, 14e. The second cladding layer 14b is sandwiched between the second and fourth modified layers 14d, 14f. Thus, a current confinement structure in the vertical direction is added.

The third and fourth modified layers 14e, 14f are formed by injecting ions of inert elements such as argon (Ar) and krypton (Kr) into the central portion 111 of the first and second cladding layers 14a, 14b. The ions are injected after the first and second modified layers 14c, 14d are formed. Alternatively, the ions may be injected before the first and second modified layers 14c, 14d are formed.

The ions are also injected into the active layer 12 sandwiched between the first and second cladding layers 14a, 14b and the first and second light confinement layers 13a, 13b. Naturally, they are modified into a fifth modified layer 112.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor laser, comprising a semiconductor laminated body formed in a ring shape and first and second electrodes, the semiconductor laminated body including:
an active layer;
first and second cladding layers formed on both sides of the active layer;
first and second contact layers formed on the first and second cladding layers and electrically connected to the first and second electrodes; and
first and second modified layers formed by selectively modifying inner peripheral sidewalls and outer peripheral sidewalls of the first and second cladding layers so as to have a refractive index lower than the refractive indexes of the first and second cladding layers and a roughness of 5 nm or less,
the second electrode being formed such that the second electrode is displaced to an inner side from a center of the second cladding layer.

2. The semiconductor laser according to claim 1, wherein the first and second modified layers are layers in which the inner peripheral sidewalls and the outer peripheral sidewalls of the first and second cladding layers are selectively oxidized.

3. The semiconductor laser according to claim 2, wherein the first and second modified layers have an electrical insulating property.

4. The semiconductor laser according to claim 1, wherein the semiconductor laminated body is a resonator in which light circulates along the outer periphery of the circular shape and is mounted on a substrate so as to optically couple with an optical waveguide provided on the substrate.

5. The semiconductor laser according to claim 1, wherein the second electrode is connected to a portion of the ring-shaped second contact layer.

6. A semiconductor laser, comprising a semiconductor laminated body formed in a ring shape and first and second electrodes, the semiconductor laminated body including:
an active layer;
first and second cladding layers formed on both sides of the active layer;
first and second contact layers formed on the first and second cladding layers and electrically connected to the first and second electrodes; and
first and second modified layers formed by selectively modifying one peripheral sidewall of the first cladding layer and another peripheral sidewall of the second cladding layer so as to have a refractive index lower than the refractive indexes of the first and second cladding layers,
the second electrode being formed such that the second electrode is displaced to an inner side from a center of the second cladding layer.

7. The semiconductor laser according to claim 6, wherein the outer peripheral sidewall of the first cladding layer is selectively modified into the first modified layer and the inner peripheral sidewall of the second cladding layer is selectively modified into the second modified layer.

8. The semiconductor laser according to claim 6, wherein the inner peripheral sidewall of the first cladding layer is selectively modified into the first modified layer and the outer peripheral sidewall of the second cladding layer is selectively modified into the second modified layer.

9. The semiconductor laser according to claim 6, wherein the first and second modified layers overlap with each other so as to sandwich the active layer.

10. The semiconductor laser according to claim 6, wherein the first and second modified layers are layers in which the one peripheral sidewall of the first cladding layer and the other peripheral sidewall of the second cladding layer are selectively oxidized.

11. The semiconductor laser according to claim 10, wherein the first and second modified layers have an electrical insulating property.

12. The semiconductor laser according to claim 6, wherein the semiconductor laminated body is a resonator in which light circulates along the outer periphery of the circular shape and is mounted on a substrate so as to optically couple with an optical waveguide provided on the substrate.

13. The semiconductor laser according to claim 6, wherein the second electrode is connected to a portion of the ring-shaped second contact layer.

14. The semiconductor laser according to claim 1 wherein the active layer is a multiple quantum well layer by alternately depositing a well layer and a barrier layer, a first light confinement layer is formed between the active layer and the first cladding layer, and a second light confinement layer is formed between the active layer and the second cladding layer.

15. The semiconductor laser according to claim 6, wherein the first and second modified layers have a roughness of 5 nm or less.

* * * * *